(12) United States Patent
Kramm et al.

(10) Patent No.: US 12,282,042 B2
(45) Date of Patent: Apr. 22, 2025

(54) CURRENT-SENSING RESISTOR

(71) Applicant: Isabellenhütte Heusler GmbH & Co. KG, Dillenburg (DE)

(72) Inventors: Benedikt Kramm, Wettenberg (DE); Felix Lebeau, Herborn (DE); Jan Sattler, Haiger (DE)

(73) Assignee: Isabellenhütte Heusler GmbH & Co. KG, Dillenburg (DE)

(*) Notice: Subject to any disclaimer, the term of this patent is extended or adjusted under 35 U.S.C. 154(b) by 97 days.

(21) Appl. No.: 18/271,915

(22) PCT Filed: Jan. 26, 2022

(86) PCT No.: PCT/EP2022/051742
§ 371 (c)(1),
(2) Date: Jul. 12, 2023

(87) PCT Pub. No.: WO2022/171439
PCT Pub. Date: Aug. 18, 2022

(65) Prior Publication Data
US 2024/0085459 A1   Mar. 14, 2024

(30) Foreign Application Priority Data

Feb. 11, 2021   (DE) .................... 10 2021 103 238.5
Sep. 30, 2021   (DE) .................... 20 2021 105 281.3

(51) Int. Cl.
*G01R 1/20*   (2006.01)
*G01R 1/04*   (2006.01)
*G01R 35/00*  (2006.01)

(52) U.S. Cl.
CPC ........... *G01R 1/203* (2013.01); *G01R 1/0416* (2013.01); *G01R 35/00* (2013.01)

(58) Field of Classification Search
CPC .......... G01R 1/02; G01R 1/04; G01R 1/0408; G01R 1/0416; G01R 1/20; G01R 1/203;
(Continued)

(56) References Cited

U.S. PATENT DOCUMENTS

2013/0181807 A1* 7/2013 Hetzler .................... H01C 7/06
                                                        338/7
2016/0041206 A1* 2/2016 Hetzler ................ G01R 35/005
                                                        324/126

(Continued)

FOREIGN PATENT DOCUMENTS

DE   10 2013 005 939 A1   10/2014
DE   10 2017 003 111 A1   10/2017
(Continued)

OTHER PUBLICATIONS

English Translation of PCT/EP/2022/051742 International Seach Report dated Apr. 26, 2022.

*Primary Examiner* — Huy Q Phan
*Assistant Examiner* — David B Frederiksen
(74) *Attorney, Agent, or Firm* — Grogan, Tuccillo & Vanderleeden LLP

(57) ABSTRACT

A current-sensing resistor for measuring a current with two connection parts for introducing and discharging the current to be measured includes a resistor element made of a resistor material, a first voltage measurement contact at the first connection part for measuring the voltage at the first connection part, a second voltage measurement contact at the second connection part for voltage measurement at the second connection part, and a cut in the second connection part, the cut surrounding the second voltage measurement contact and preventing current flow across the cut. The resistor also includes a third voltage measurement contact arranged at the second connection part for measuring the voltage at the second connection part, and that the third (Continued)

voltage measurement contact is arranged at the second connection part offset with respect to the main current flow direction transversely to the second voltage measurement contact at the second connection part.

35 Claims, 10 Drawing Sheets

(58) Field of Classification Search
CPC .. G01R 15/146; G01R 19/0092; G01R 35/00; H01C 1/14
See application file for complete search history.

(56) References Cited

U.S. PATENT DOCUMENTS

| | | |
|---|---|---|
| 2017/0089955 A1 | 3/2017 | Yugou et al. |
| 2020/0200799 A1* | 6/2020 | Hung ..................... H01C 1/14 |

FOREIGN PATENT DOCUMENTS

| | | |
|---|---|---|
| DE | 11 2018 004830 T5 | 6/2020 |
| DE | 10 2020 111 634 B3 | 4/2021 |
| EP | 0 605 800 A1 | 7/1994 |
| EP | 3 671 225 A1 | 6/2020 |
| WO | 2012019784 A1 | 2/2012 |

\* cited by examiner

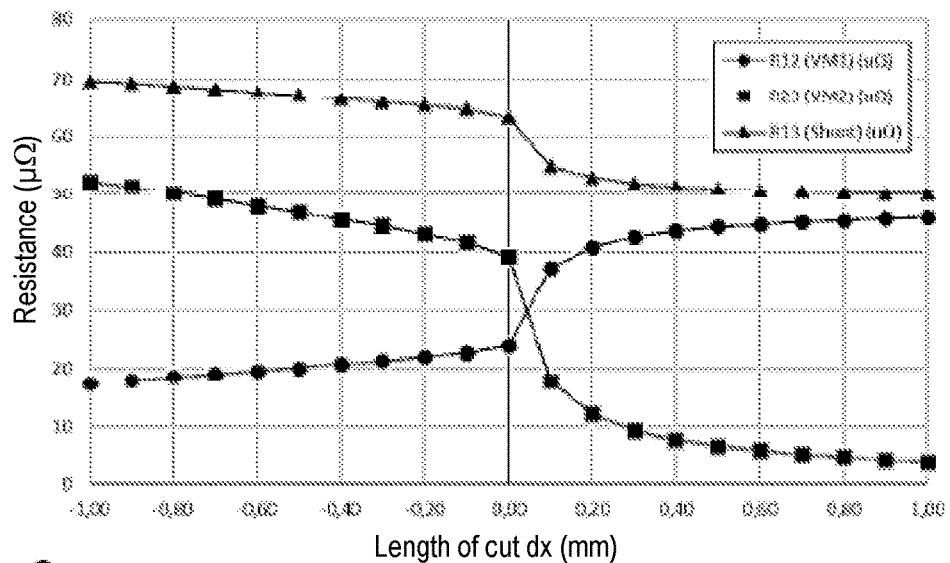
Fig. 3 (origin corresponds to transition resistor element/conductive connection)
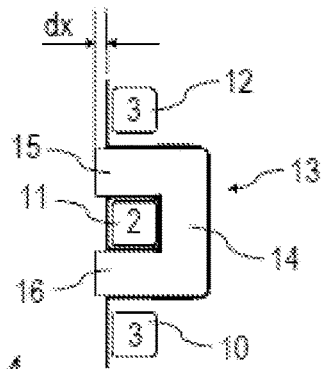
Fig. 4
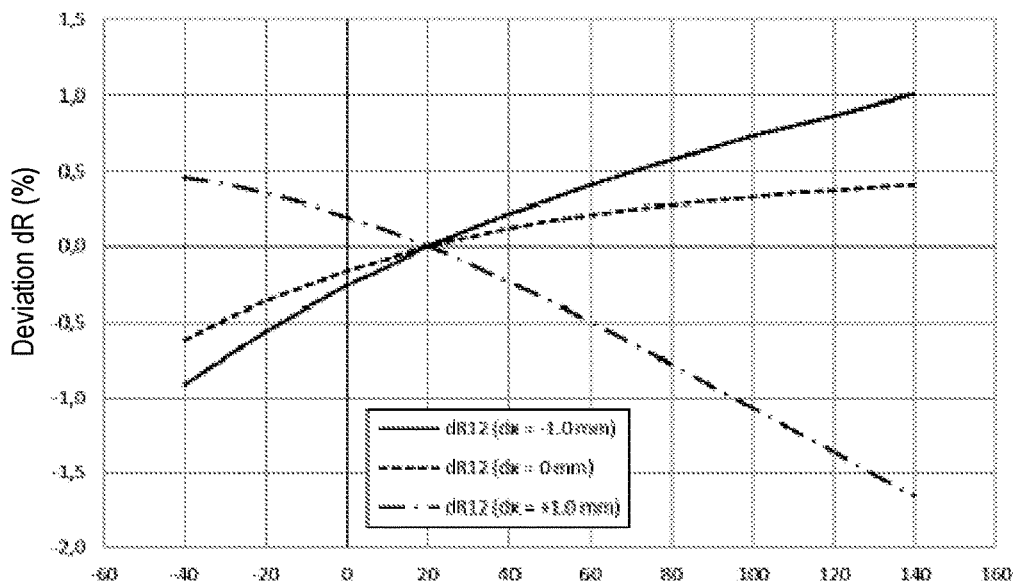
Fig. 5

CURRENT-SENSING RESISTOR

CROSS REFERENCE TO RELATED APPLICATIONS

This application is a national stage of International Application No. PCT/EP2022/051742 filed on Jan. 26, 2022, which claims priority to German Patent Application No. 10 2021 103 238.5 filed Feb. 11, 2021 and German Patent Application No. DE 20 2021 105 281.3 filed Sep. 30, 2021, all of which is hereby incorporated by reference in its entirety.

TECHNICAL FIELD OF THE INVENTION

The invention relates to a current-sensing resistor for measuring an electric current according to the four-wire technique.

BACKGROUND OF THE INVENTION

From EP 0 605 800 A1 it is known to measure an electric current by means of a low-resistance current-sensing resistor ("shunt") according to the four-wire technique. The electric current to be measured is passed through the low-resistance current-sensing resistor, whereby the voltage drop across the low-resistance current-sensing resistor is measured. The measured voltage drop across the low-resistance current-sensing resistor is then a measure of the electric current flowing through the low-resistance current-sensing resistor in accordance with Ohm's law.

Furthermore, a further developed low-resistance current-sensing resistor is known from WO 2012/019784 A1, in which the voltage measurement contacts of the low-resistance current-sensing resistor are surrounded by cuts, which are also referred to as current shadows and prevent a current flow across the respective cut. These cuts have a positive influence on the electric field distribution in the low-resistance current-sensing resistor. A disadvantage of this known current-sensing resistor according to the prior art is the fact that measuring errors cannot be readily detected.

With regard to the technical background of the invention, reference should also be made to DE 10 2020 111 634 B3, DE 10 2013 005 939 A1, US 2017/0089955 A1 and EP 3 671 225 A1.

DESCRIPTION OF THE INVENTION

The invention is therefore based on the task of creating an appropriately improved low-resistance current-sensing resistor.

This task is solved by a current-sensing resistor according to the invention in accordance with the main claim.

The invention comprises the general technical teaching of providing a three-point tap for voltage measurement on a low-resistance current-sensing resistor, the three-point tap enabling three voltage measurements to be made on a closed loop which extends over the resistor element. The three-point tap thus provides three measurement channels that provide three voltage measurement values. For an error-free measurement, the sum of all voltages in the closed loop must be zero according to Kirchhoff's second law. However, in the event of a measurement error, a deviation from zero occurs, which enables error detection.

First of all, in accordance with the known current-sensing resistor described at the beginning, the current-sensing resistor according to the invention has a first connection part which consists of an electrically conductive conductor material (e.g. copper) and preferably serves to introduce the electric current to be measured into the current-sensing resistor.

Furthermore, the current-sensing resistor according to the invention has, in accordance with the known current-sensing resistor described at the beginning, a second connection part which also consists of an electrically conductive conductor material (e.g. copper) and preferably serves to conduct the electric current to be measured out of the current-sensing resistor again.

Furthermore, the current-sensing resistor according to the invention also has a resistor element made of a resistor material (e.g. Manganin®), the resistor element being arranged in the main current flow direction between the first connection part and the second connection part, so that the electric current to be measured flows through the resistor element.

Furthermore, the current-sensing resistor according to the invention also comprises a first voltage measurement contact at the first connection part and a second voltage measurement contact at the second connection part for voltage measurement.

The second voltage measurement contact is surrounded by a cut, which is also referred to as a current shadow and prevents a current flow across the cut. In contrast to the known current-sensing resistor according to WO 2012/019784 A1, in the current-sensing resistor according to the invention a cut (current shadow) is preferably only provided in one of the two connection parts, while the other connection part does not contain such a cut.

The current-sensing resistor according to the invention is characterized by the fact that a third voltage measurement contact is additionally arranged at the second connection part in order to measure the voltage at the second connection part. The third voltage measurement contact on the second connection part is arranged offset with respect to the main current flow direction transverse to the second voltage measurement contact on the second connection part. The three voltage measurement contacts thus enable the three-point tap already mentioned above and form a closed loop for voltage measurement, which enables the diagnostic function mentioned above. With four voltage measurement contacts, two such loops can then be formed, each comprising three voltage measurement contacts, whereby the sum of the voltages on one loop circuit must then be zero.

In a preferred embodiment of the invention, the first voltage measurement contact on the first connection part and the second voltage measurement contact on the second connection part together form a first measurement channel for voltage measurement, with a first voltage measurement value ($U_{12}$) being output on the first measurement channel. The first voltage measurement at the first measurement channel is preferably carried out parallel to the main current flow direction in the current-sensing resistor. Furthermore, in this embodiment it is provided that the first voltage measurement contact at the first connection part together with the third voltage measurement contact at the second connection part forms a second measurement channel in order to measure a second voltage drop ($U_{13}$) across the resistor element and obliquely to the main current flow direction. Furthermore, the second voltage measurement contact on the second connection part preferably forms a third measurement channel together with the third voltage measurement contact on the second connection part in order to measure a third voltage drop ($U_{23}$) transverse to the main current flow direction, in particular at right angles to the main current flow direction. The three measurement channels thus provide three measured voltage values (U12, U13, U23), which add up to zero in the case of an error-free measurement taking the sign into account. In case of a deviation from zero, on the other hand, there is a measurement error.

In another embodiment of the invention, on the other hand, the second voltage measurement contact on the second connection part forms, together with the third voltage measurement contact on the second connection part, a first measurement channel for measuring a first voltage drop (U23) transverse to the main current flow direction, in particular at right angles to the main current flow direction. In this embodiment, the first voltage measurement contact on the first connection part preferably forms a second measurement channel together with the third voltage measurement contact on a second connection part in order to measure a second voltage drop (U13) across the resistor element obliquely to the main current flow direction. In addition, the first voltage measurement contact on the first connection part together with the second voltage measurement contact on the second connection part preferably forms a third measurement channel in order to measure a third voltage drop (U12) across the resistor element and preferably parallel to the main current flow direction. In this embodiment, too, a three-point tap is made possible with the diagnostic function described above.

Furthermore, it is possible within the scope of the invention that a fourth voltage measurement contact is arranged on the second connection part, which is electrically conductively connected to the third voltage measurement contact, in order to measure the voltage jointly at the third voltage measurement contact and at the fourth voltage measurement contact. The third voltage measurement contact and the fourth voltage measurement contact thus provide a common voltage tap.

In addition, a fifth voltage measurement contact can be arranged on the first connection part, which is electrically conductively connected to the first voltage measurement contact in order to measure the voltage jointly at the first voltage measurement contact and at the fifth voltage measurement contact. The first voltage measurement contact and the fifth voltage measurement contact thus form a common voltage tap.

Furthermore, it should be mentioned that the first voltage measurement contact on the first connection part is preferably arranged centrally with respect to the side edges of the current-sensing resistor, in particular with an eccentricity that is smaller than 50%, 40%, 30%, 20%, 10% or even 5% of the width of the current-sensing resistor.

The same preferably applies to the second voltage measurement contact and the cut surrounding it in the second connection part, which are also preferably arranged centrally with respect to the side edges of the current-sensing resistor, in particular with an eccentricity which is smaller than 50%, 40%, 30%, 20%, 10% or 5% of the width of the current-sensing resistor.

On the other hand, the third voltage measurement contact on the second connection part is preferably arranged off-center so that the three-point tap forms a triangular loop over the resistor element.

Furthermore, it is to be mentioned that the first voltage measurement contact at the first connection part and the second voltage measurement contact at the second connection part preferably have essentially the same distance to the side edges of the current-sensing resistor, so that the first voltage drop across the resistor element is measured parallel to the main current flow direction in the current-sensing resistor.

Furthermore, it is to be mentioned that in the second connection part the third voltage measurement contact and the optional fourth voltage measurement contact may preferably have substantially the same distance to the centre axis of the current-sensing resistor.

Furthermore, it should be mentioned that in the second connection part the second voltage measurement contact is preferably arranged between the third and—if present—the fourth voltage measurement contact.

The aforementioned cut (current shadow) in the second connection part is preferably arc-shaped, in particular V-shaped or U-shaped. The base of the arcuate cut is preferably aligned transversely to the main current flow direction in the current-sensing resistor, while the legs of the arcuate cut are preferably aligned essentially parallel to the main current flow direction and face the resistor element.

With regard to the length of the legs of the cut, there are different possibilities within the scope of the invention, which are briefly described below.

In one variant of the invention, the legs of the cut extend into the resistor element in the main flow direction and end in the resistor element. In this case, it is again possible for the two legs to project into the resistor element to the same extent or to different extents. The length of the legs within the resistor element can be in the range of 0.1 mm-3 mm, 0.2 mm-2 mm, 0.5 mm-1.5 mm or approximately 1 mm.

In another invention variant, on the other hand, the legs of the cut end in front of the resistor element in the main flow direction, i.e. the legs of the cut do not project into the resistor element. In this case, the legs can be at a distance from the resistor element, which can be in the range of 0.1 mm-3 mm, 0.2 mm-2 mm, 0.5 mm-1.5 mm or 1 mm, for example.

In a third variant of the invention, on the other hand, the legs of the cut extend exactly to the boundary between the resistor element and the second connection part.

Furthermore, it should be mentioned that in the second connection part the second voltage measurement contact and the surrounding cut may alternatively be arranged off-center. This means that the second voltage measurement contact and the surrounding cut have a smaller distance to one side edge of the current-sensing resistor than to the opposite side edge. In this case, the cut preferably starts from the nearer side edge of the current-sensing resistor and extends in an arcuate or L-shaped manner into the resistor element or at least to the boundary between the second connection part and the resistor element.

In general, it should be noted that the invention is not limited to a particular conductor material of the connection parts. For example, the conductor material may be copper, a copper alloy, aluminium or an aluminium alloy.

However, it should be mentioned that the conductor material of the connection parts typically has a lower specific electrical resistance than the resistor material of the resistor element.

Also, with respect to the resistor material of the resistor element, the invention is not limited to a particular resistor material. For example, a copper alloy may be used, such as a copper-manganese alloy. Examples include CuMn12Ni2 or CuMn7Sn2,3 Furthermore, a copper-manganese-nickel alloy may also be used, such as Cu84Ni4Mn12 or Cu65Mn25Ni10. Furthermore, a copper-chromium alloy may alternatively be used, or a nickel alloy.

In the preferred embodiment of the invention, the resistor element is electrically and mechanically connected to the two adjacent connection parts, for example by a welded connection, whereby an electron welded connection has proven to be particularly advantageous.

The resistor material of the resistor element preferably has a relatively small specific electrical resistance, which is preferably smaller than $2 \cdot 10^{-4} \Omega \cdot m$, $2 \cdot 10^{-5} \Omega \cdot m$ or $2 \cdot 10^{-6} \Omega \cdot m$. The specific electrical resistance of the resistor material, on the other hand, is preferably greater than $2 \cdot 10^{-6} \Omega \cdot m$, $2 \cdot 10^{-7} \Omega \cdot m$.

The conductor material of the connection parts, on the other hand, preferably has an even lower specific electrical resistance, which is preferably less than $10-6\Omega \cdot m$ or $10-7\Omega \cdot m$.

It has already been mentioned above that the current-sensing resistor in the preferred embodiment is of low resistance. For example, the resistance value may be at most $1\mu\Omega$, $10\mu\Omega$, $20\mu\Omega$, $33\mu\Omega$, $50\mu\Omega$, $100\mu\Omega$, $500\mu\Omega$, 10 m$\Omega$, 5 m$\Omega$, 2 m$\Omega$ or 1 m$\Omega$.

Furthermore, it should be mentioned that the current-sensing resistor according to the invention can have a current carrying capacity which allows at least 1 A, 10 A, 100 A, 1 kA or even 5 kA at a continuous load.

With regard to the constructive design of the current-sensing resistor, it should be mentioned that the resistor element and the connection parts are preferably each plate-shaped, whereby the plate-shaped parts can optionally be flat or curved.

The length of the current-sensing resistor in the main current flow direction is preferably smaller than 30 cm, 20 cm, 10 cm, 5 cm, 2 cm or 1 cm, while the width is preferably smaller than 20 cm, 10 cm, 5 cm, 2 cm or 1 cm. On the other hand, the thickness of the current-sensing resistor is preferably smaller than 10 mm, 5 mm, 4 mm, 2 mm or 1 mm.

Furthermore, it should be mentioned that the two connection parts may each comprise a current connection for introducing or discharging the electric current into the current-sensing resistor, wherein these current connections may, for example, comprise a hole which may receive a screw, as is known per se from EP 0 605 800 A1.

The individual voltage measurement contacts may each be formed as contact pads consisting of an electrically conductive coating on the respective connection part. These contact pads can, for example, be essentially rectangular, whereby the coating material of the contact pads can consist of a different conductor material than the underlying connection parts.

Furthermore, it should be mentioned that trim cuts can be made in the resistor element on one or both sides in order to adjust the resistance value of the current-sensing resistor and/or the temperature coefficient of the resistance value of the current-sensing resistor.

In the preferred embodiment of the invention, the current-sensing resistor has voltage measurement contacts for exactly three voltage measurement channels in order to enable the three-point tap mentioned at the beginning. The three-point tap enables voltage measurement along a closed loop above the resistor element, which enables a diagnostic function.

The current-sensing resistor according to the invention has been described above as a single component. However, the invention also claims protection for a current measuring device comprising such a current-sensing resistor and a voltage measuring device for separate voltage measurement at the individual measurement channels of the current-sensing resistor.

Furthermore, the current measuring device can also have an evaluation unit to determine the current flowing through the current-sensing resistor from the various voltage measurement values. Here, the evaluation unit can also fulfil a diagnostic function. For this purpose, the voltage measuring unit can measure the voltages at the three measurement channels of the three-point tap and then calculate the voltage deviation that occurs during a circulation measurement along the closed loop. The evaluation unit can then generate an error signal if the deviation exceeds an allowable maximum value.

Other advantageous embodiments of the invention are indicated in the dependent claims or will be explained in more detail below together with the description of the preferred embodiments of the invention with reference to the figures.

BRIEF DESCRIPTION OF THE DRAWINGS

FIG. 3 shows the course of the resistance value as a function of the length of the cut of the legs within the resistor element.

FIG. 4 shows an enlarged detailed view of the current-sensing resistor from FIGS. 1A and 1B in the area of the cut.

FIG. 5 shows the change in resistance value as a function of temperature for different lengths of the cut inside and outside the resistor element.

DETAILED DESCRIPTION OF THE DRAWINGS

Figure 1A:
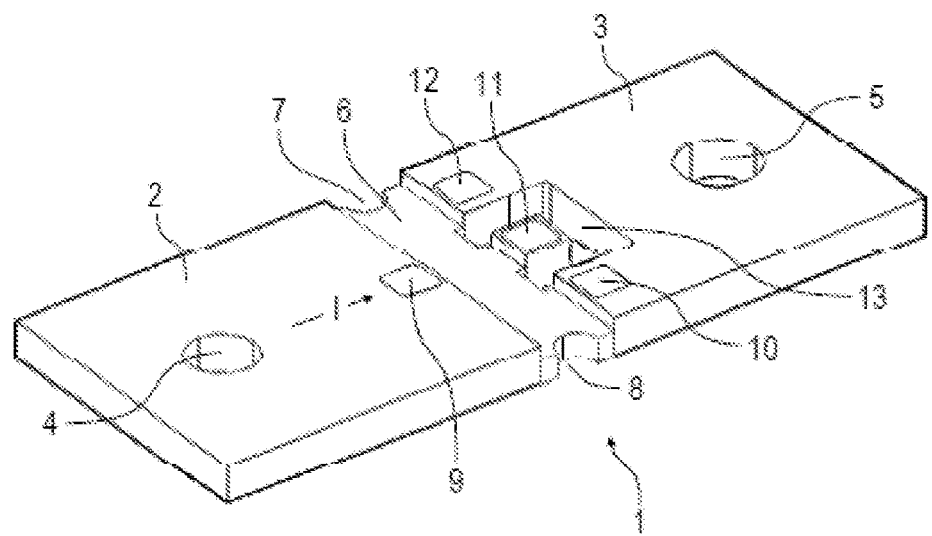
FIG. 1A shows a perspective view of a current-sensing resistor according to the invention with a three-point tap.
Figure 1B:
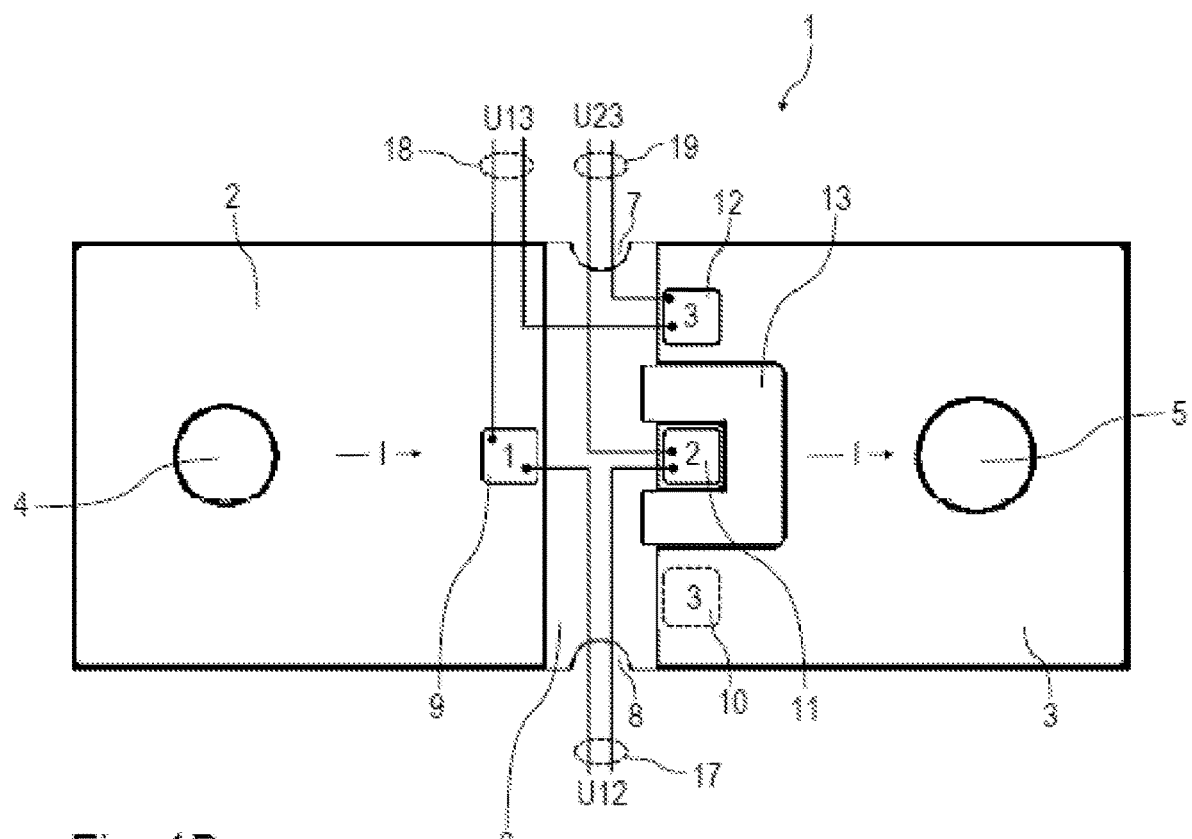
FIG. 1B shows a top view of the current-sensing resistor according to FIG. 1A.

In the following, the embodiment of a current-sensing resistor 1 according to the invention is described, which is shown in FIGS. 1A and 1B. Thus, the current-sensing resistor 1 serves for current measurement according to the four-wire technique, which is known per se from the prior art.

First of all, the current-sensing resistor 1 comprises a first plate-shaped connection part 2 made of copper, which serves to introduce an electric current I into the current-sensing resistor 1.

In addition, the current-sensing resistor 1 comprises a plate-shaped connection part 3, which is also made of copper and is used to lead the electrical current I out of the current-sensing resistor 1.

In each of the two connection parts 2, 3 there is a hole 4 or 5 for the passage of a screw for current contact, as is already known from EP 0 605 800 A1.

A resistor element 6 made of a resistor material (e.g. Manganin®) is located between the two connection parts 2, 3, whereby the resistor element 6 is connected at its edges to the two connection parts 2 and 3 by electron beam welding.

In the resistor element 6 there are trim cuts 7, 8 on the sides for adjusting the resistance value and the temperature coefficient of the current-sensing resistor 1, as is known per se from the prior art.

On the upper side of the current-sensing resistor 1 there are four voltage measurement contacts 9, 10, 11, 12 on the two connection parts 2, 3 for measuring the electrical voltage dropping across the resistor element 6 and also for enabling a diagnostic function, as will be described in detail.

The voltage measurement contact 11 in the second connection part 3 is here centrally arranged and surrounded by a cut 13, which is also referred to as a current shadow and prevents a current flow at right angles across the cut 13. The cut 13 is U-shaped with a base 14 at right angles to the main current flow direction in the current-sensing resistor 1 and two legs 15, 16 which are aligned parallel to the main current flow direction in the current-sensing resistor 1 and face the resistor element 6, whereby the legs 15, 16 of the cut 13 in this embodiment project into the resistor element 6 (cf. FIG. 4).

The voltage measurement contact 9 forms a first measurement channel 17 together with the voltage measurement contact 11, at which a corresponding voltage measurement value U12 is output.

Furthermore, the voltage measurement contact 9 forms a second measurement channel 18 with the voltage measurement contact 12, at which a further voltage measurement value U13 is output.

Finally, the voltage measurement contact 11 together with the voltage measurement contact 12 forms a third measurement channel 19 at which a further voltage measurement value U23 is output.

The voltage measurement contacts 9, 11 and 12 here form a closed loop over the resistor element 6, so that the sum of all voltages in the loop must be zero in accordance with Kirchhoff's second law. The voltage taps 9, 11, 12 thus form a three-point tap, which enables a diagnostic function, as will be described in detail later.

The optional voltage measurement contact 10 is conductively connected to the voltage measurement contact 12 so that the voltage measurement contacts 10, 12 form a common voltage tap.

Figure 2A:
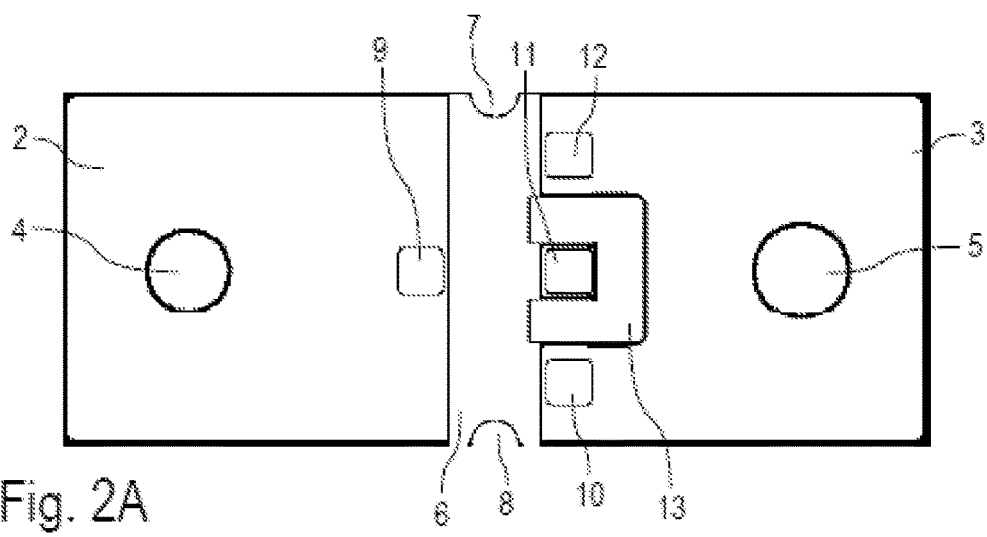
FIG. 2A shows a top view of a current-sensing resistor according to the invention similar to the current-sensing resistor according to FIGS. 1A and 1B.

The embodiment according to FIG. 2A largely corresponds to the embodiment described above, so that reference is made to the previous description in order to avoid repetitions, whereby the same reference signs are used for corresponding details. In this embodiment, too, the two legs 15, 16 of the U-shaped recess 13 project into the resistor element 6.

Figure 2B:
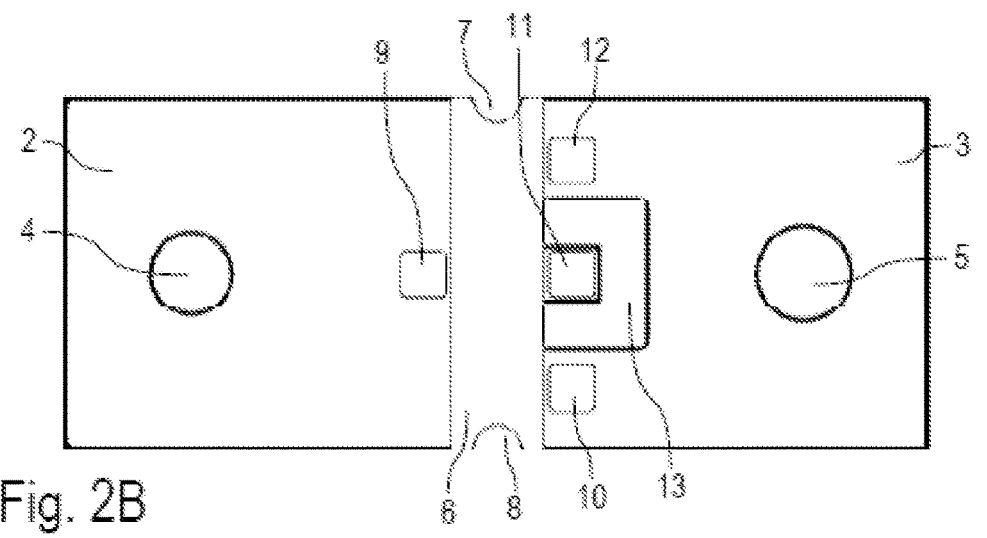
FIG. 2B shows a modification of the current-sensing resistor in FIG. 2A, with the legs of the cut ending at the boundary with the resistor element.

In the variant according to FIG. 2B, the legs 15, 16 of the U-shaped cut 13 do not extend into the resistor element 6, but end at the boundary between the resistor element 6 and the connection part 3.

Figure 2C:
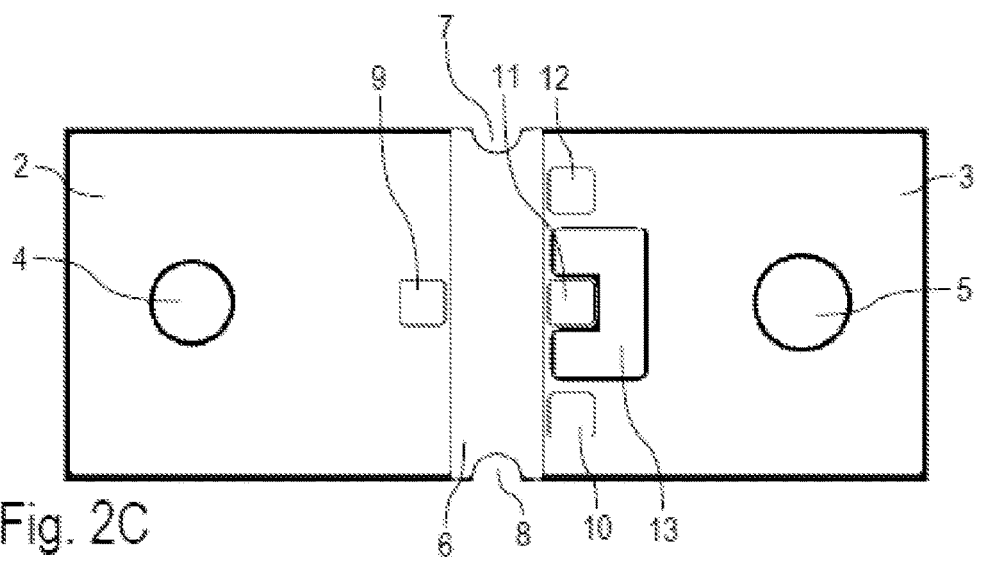
FIG. 2C shows a modification of the current-sensing resistor according to FIG. 2A, whereby the legs of the cut do not extend into the resistor element.

In the variant according to FIG. 2C, the legs 15, 16 of the U-shaped cut 13 therefore even end inside the connection part 3 and thus do not reach the boundary between the resistor element 6 and the connection part 3.

FIG. 4 shows an enlargement of the embodiment according to FIG. 1B in the area of the U-shaped cut 13. Here it can be seen that the legs 15, 16 of the U-shaped cut 13 extend with a length dx into the resistor element 6.

FIG. 3 shows the dependence of the resistance value on the cut length dx for the partial resistances R12, R13, R23 of the three-point tap (U12, U13, U23).

Furthermore, FIG. 5 shows the relative change dR12 of the resistance value R12 as a function of temperature for different values of dx.

Figure 6:
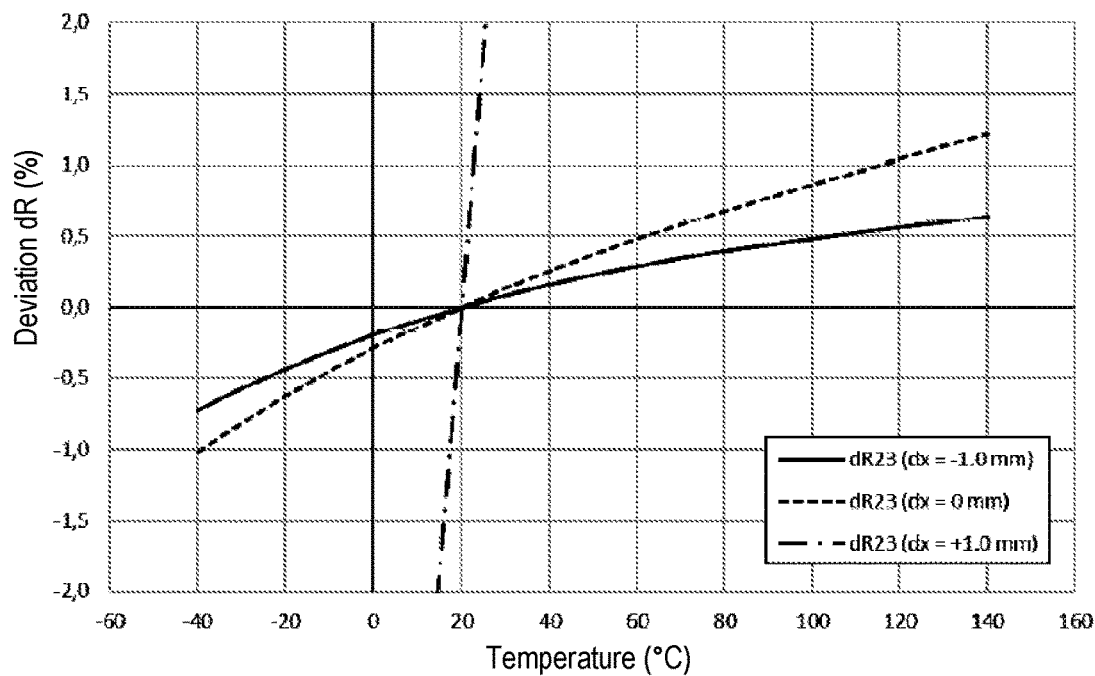
FIG. 6 shows the change in resistance value as a function of temperature, also for different cut lengths inside and outside the resistor element.

Another such diagram for R23 is also shown in FIG. 6.

Figure 7:
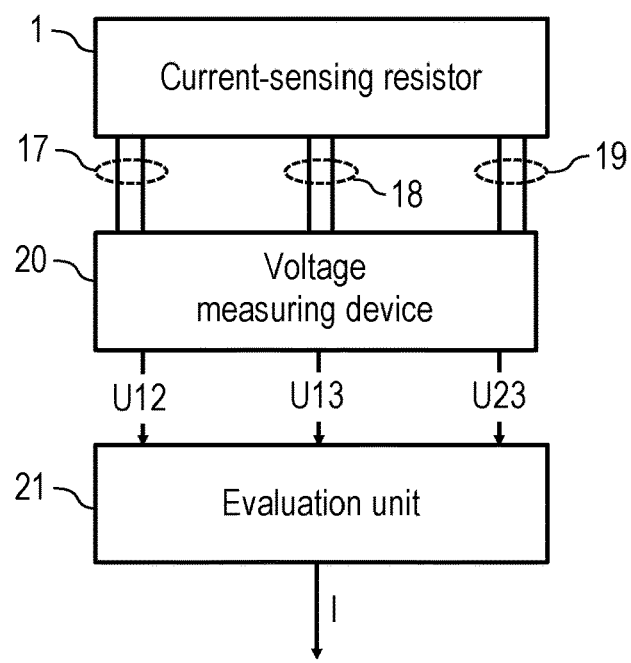
FIG. 7 shows a current measuring device according to the invention with the current-sensing resistor according to the invention.

FIG. 7 now shows the current-sensing resistor 1 according to the invention no longer as an individual component, but as a component of a current measuring device.

The voltage measurement channels 17, 18 and 19 are read out by a voltage measurement device 20, which records the three voltage measurement values U12, U13 and U23. The voltage measuring device 20 then passes the measured voltage values U12, U13, U23 on to an evaluation unit 21, which has two functions.

On the one hand, the evaluation unit 21 calculates the current I flowing through the current-sensing resistor 1 from the measured voltage values U12, U13, U23 in accordance with Ohm's law.

Figure 10:
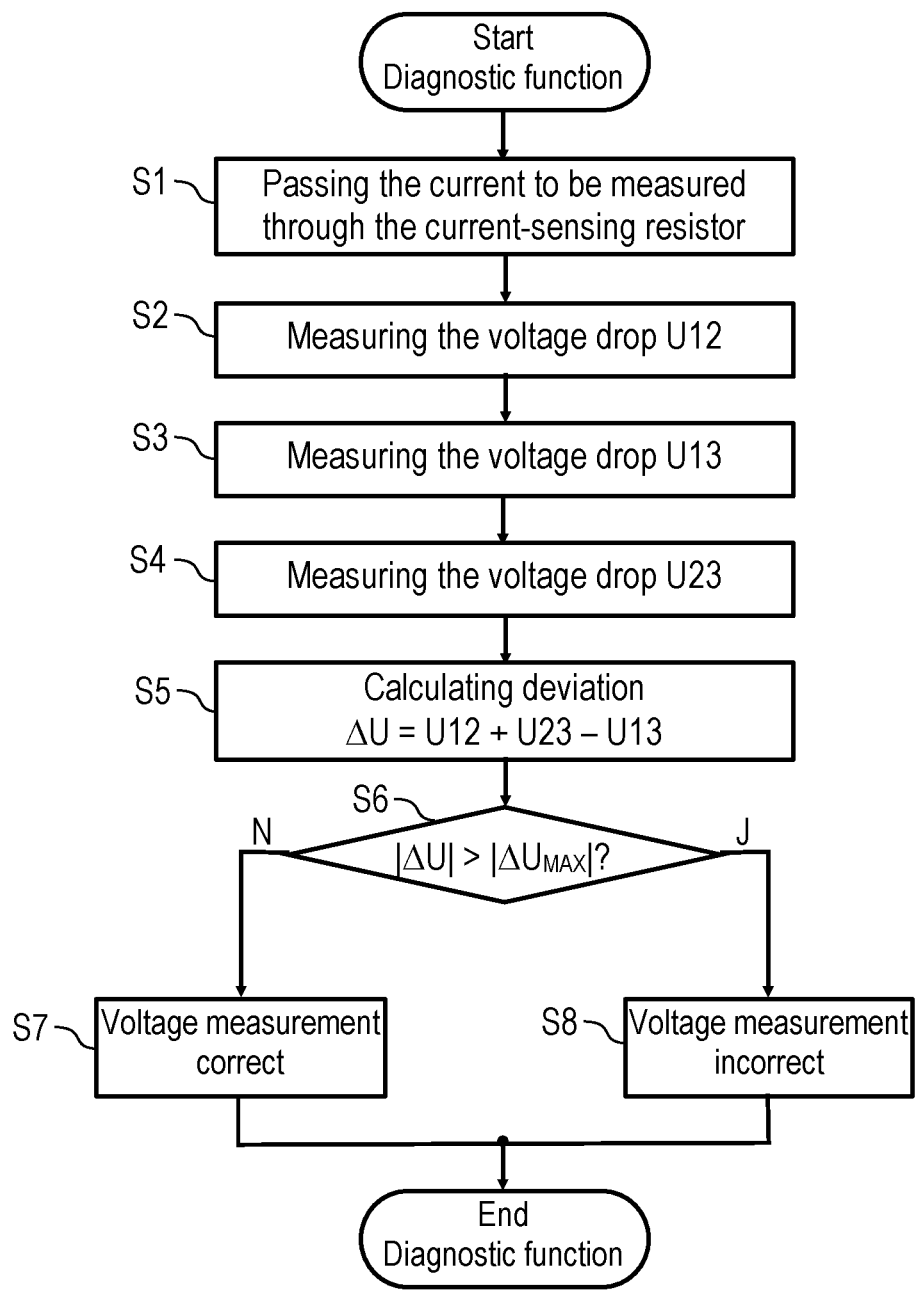
FIG. 10 shows a flow chart illustrating a diagnostic procedure according to the invention.

On the other hand, the evaluation unit 21 also performs a diagnostic function in order to detect measurement errors, whereby the diagnostic function is described below with reference to the flow diagram in FIG. 10. It has already been mentioned above that the measured stress values U12, U13, U23 represent the stresses in a closed loop and must therefore be zero in sum according to Kirchhoff's second law.

The diagnostic method according to the invention therefore provides in a step S1 that the current to be measured is passed through the current-sensing resistor 1.

In steps S2-S4, the voltage drops U12, U13, U23 are then measured.

In the next step S5, the calculation of a deviation $\Delta U = U12 + U23 - U13$ is then carried out.

In the next step S6 it is then checked whether the deviation $\Delta U$ exceeds a predetermined maximum value $U_{MAX}$.

If this is the case, it is assumed in step S8 that the current measurement was faulty.

Otherwise, it is assumed in step S7 that the current measurement was correct.

Figure 8:
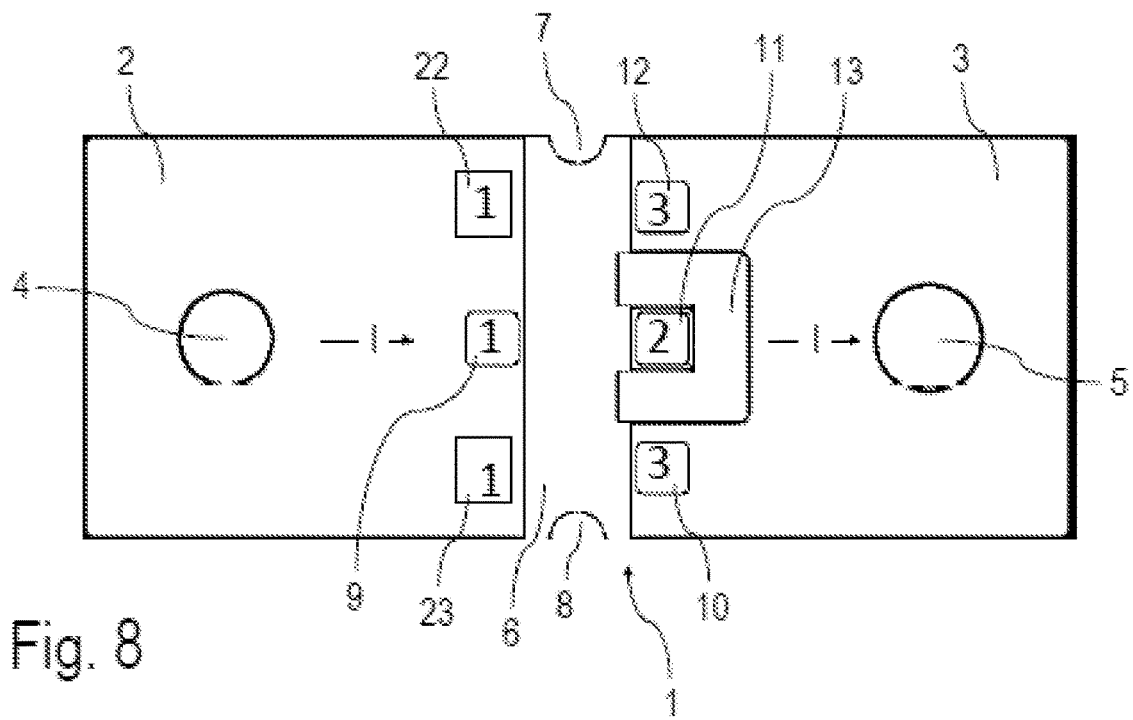
FIG. 8 shows a top view of a modified embodiment of a current-sensing resistor according to the invention.

FIG. 8 shows a modification of the embodiments described above, so that to avoid repetition, reference is made to the above description, whereby the same reference signs are used for corresponding details.

A special feature of this embodiment is that further voltage measurement contacts 22, 23 are arranged in the connection part 2 next to the voltage measurement contact 9, which however form a common voltage tap with the voltage measurement contact 9.

The embodiment according to FIG. 9 again partly corresponds to the embodiments described above, so that in order to avoid repetitions, reference is again made to the above description, whereby the same reference signs are used for corresponding details.

A special feature of this embodiment is that the cut 13 is not U-shaped, but L-shaped. The L-shaped cut 13 starts from one side edge of the current-sensing resistor 1 and extends with the other leg into the resistor element 6.

Figure 9:
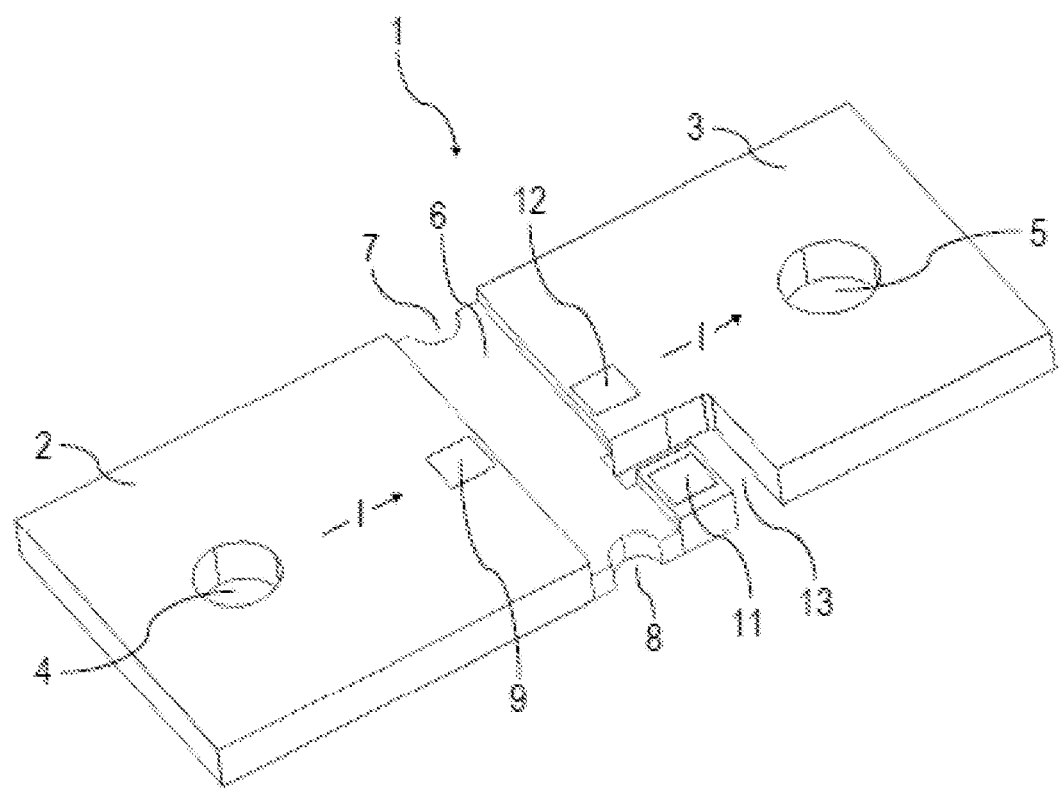
FIG. 9 shows a perspective view of a modified embodiment of a current-sensing resistor according to the invention.
Figure 11A:
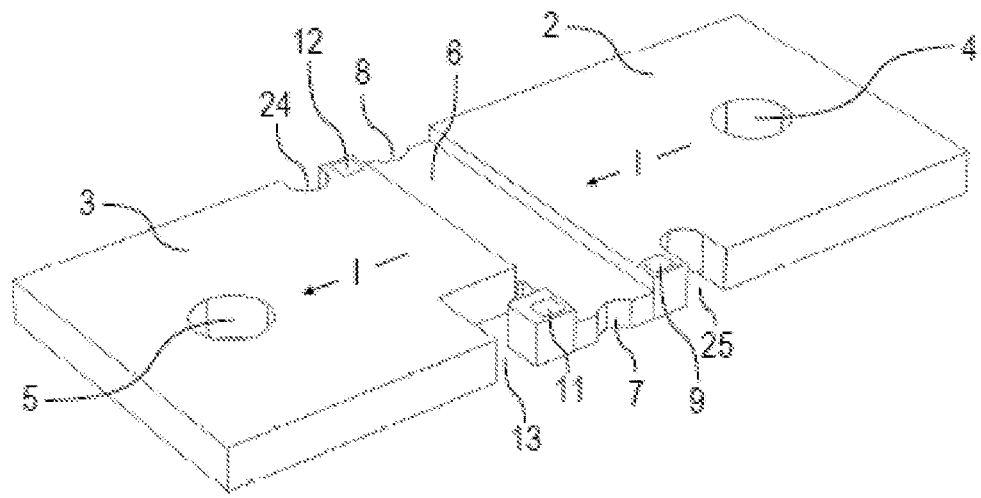
FIG. 11A shows a modification of the embodiment according to FIG. 9 with two additional cuts to influence the temperature behaviour.

The embodiment according to FIG. 11A largely corresponds to the embodiment according to FIG. 9, so that in order to avoid repetitions, reference is made to the above description, whereby the same reference signs are used for corresponding details.

A special feature of this embodiment is that a further cut 24 is arranged laterally in the connection part 3, which prevents a current flow across the cut 24.

The cut 24 starts from the lateral edge of the connection part 3 and runs transversely to the main current flow direction in the current-sensing resistor 1.

Between the cut 24 and the resistor element 6, the voltage measurement contact 12 is located on a contact pad which is separated from the cut 24.

Furthermore, a cut 25 is also arranged in the connection part 2, which prevents a current flow across the cut 25.

In this case, the cut 25 starts from the opposite lateral edge of the connection part 2 and extends transversely to the main current flow direction in the current-sensing resistor 1. The two cuts 24, 25 are thus arranged on opposite sides of the current-sensing resistor 1, whereby the two cuts 24, 25 have a different length in this case, i.e. the cut 25 is longer than the cut 24.

Between the cut 25 and the resistor element 6 the voltage measurement contact 9 is located on a contact pad which is separated from the cut 25.

Figure 11B:
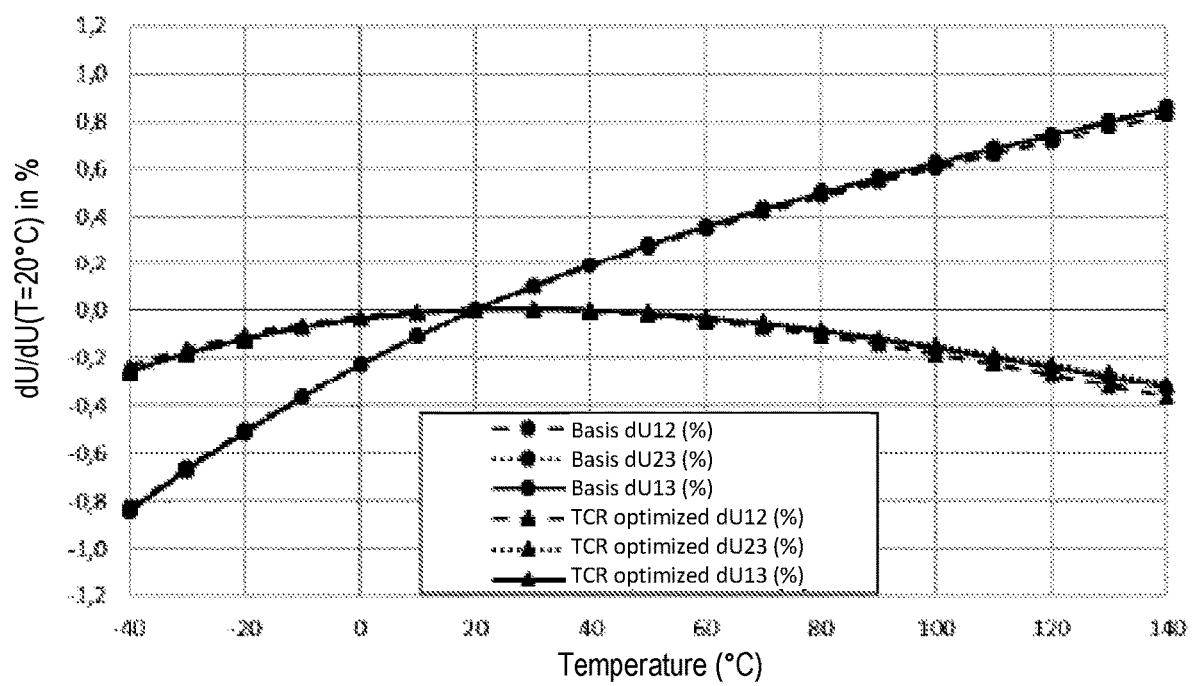
FIG. 11B shows a diagram illustrating the temperature behaviour in the embodiment according to FIG. 11A.

The cuts 24, 25 improve the temperature behaviour of the current-sensing resistor 1, as can be seen from the diagram in FIG. 11B. Thus, the various characteristics in FIG. 11B show the relative change in various voltage measurements U12, U23 and U13 as a function of temperature. The voltage U12 is measured between the two voltage measurement contacts 9, 11, while the voltage U23 is measured between the two voltage measurement contacts 11, 12. Finally, the voltage U13 is measured between the voltage measurement contacts 9, 12. In the diagram, the round measuring points show the temperature dependence without the cuts 24, 25, while the triangular measuring points show the corresponding curve for the embodiment according to FIG. 11A with the cuts 24, 25. The comparison of the different characteristics clearly shows that the temperature dependence of the measured voltage values is significantly reduced by the two cuts 24, 25.

Figure 12:
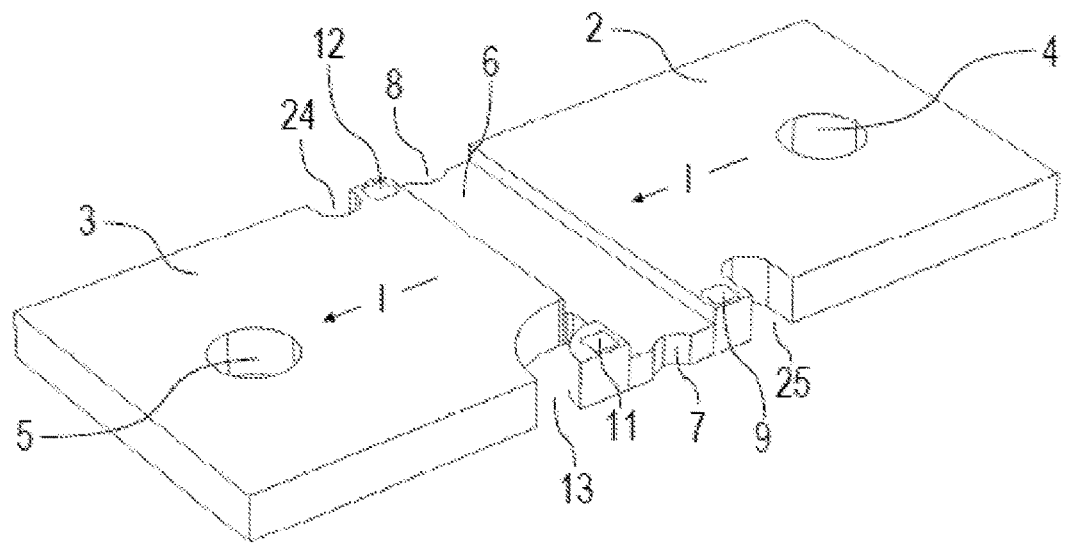
FIGS. 12-17 show various modifications of the embodiment according to FIG. 11A.

The embodiment according to FIG. 12 largely corresponds to the embodiment described above and shown in FIG. 11A, so that in order to avoid repetition, reference is made to the above description, whereby the same reference signs are used for corresponding details.

A special feature of this embodiment is that the cut 13 is not L-shaped but circular.

Figure 13:
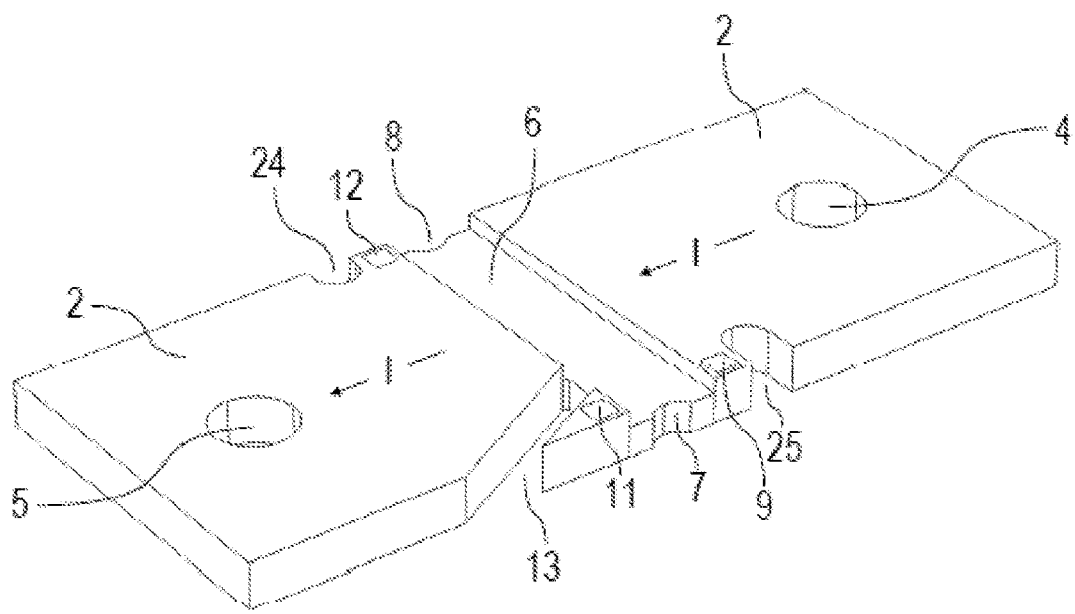

FIG. 13 shows a further modification of the embodiment according to FIG. 11A, so that in order to avoid repetitions, reference is again made to the above description, whereby the same reference signs are used for corresponding details.

A special feature of this embodiment is that the cut 13 is neither L-shaped nor circular, but runs straight and is aligned obliquely to the side edge of the current-sensing resistor 1.

Figure 14:
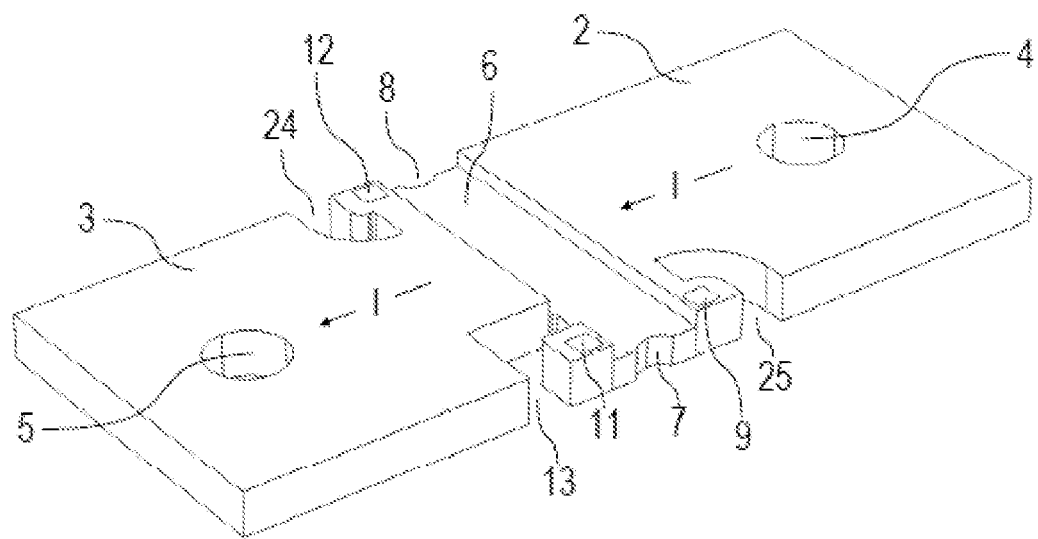

FIG. 14 shows a further modified embodiment which largely corresponds to the embodiment described above and shown in FIG. 11A, so that reference can again be made to the above description in order to avoid repetition.

A special feature of this embodiment is that the two cuts 24, 25 are circular. The two cuts 24, 25 start here from opposite side edges of the current-sensing resistor 1 and then run in an arc towards the resistor element 6, whereby the cuts 24, 25 do not extend as far as the resistor element 6.

Figure 15:
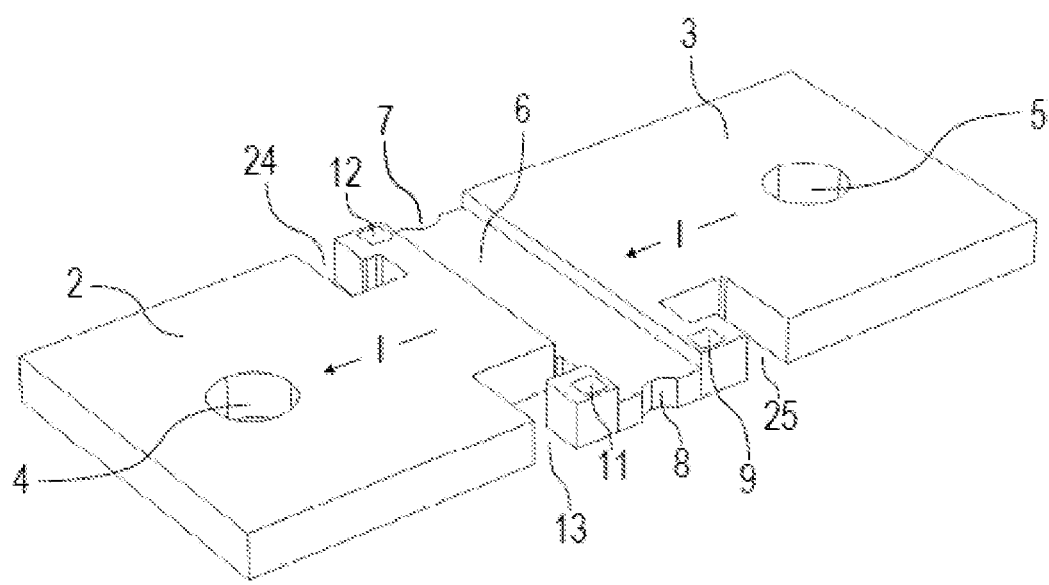

FIG. 15 shows a further modification of the embodiment according to FIG. 11A, so that in order to avoid repetition, reference is again made to the above description of FIG. 11A, whereby the same reference signs are used for corresponding details.

A special feature of this embodiment is that the two cuts 24, 25 are L-shaped. The two cuts 24, 25 start from opposite side edges of the current-sensing resistor 1 and are then angled towards the resistor element 6, whereby the cuts 24, 25 do not reach the resistor element 6.

Figure 16:
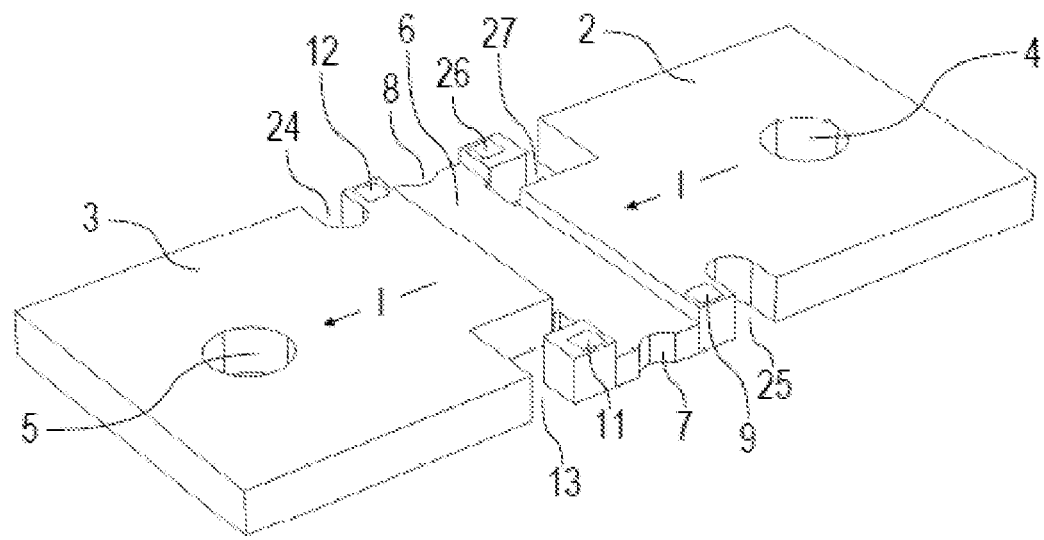

FIG. 16 shows a further modification of FIG. 11A, so that in order to avoid repetition, reference is again made to the above description, the same reference signs being used for corresponding details.

A special feature of this embodiment is that a further voltage measurement contact 26 is additionally provided in the connection part 2, the voltage measurement contact 26 being located on a side edge of the connection part 2 adjacent to the resistor element 6.

In addition, the connection part 2 has a further cut 27 which starts from the side edge of the connection part 2 and then extends in an L-shape into the resistor element 6, the cut 27 in the connection part 2 separating a contact pad for the voltage measurement contact 26.

In this embodiment, the current-sensing resistor 1 thus has four voltage measurement contacts 9, 11, 12, 26, which enables a variety of voltage measurements.

Figure 17:
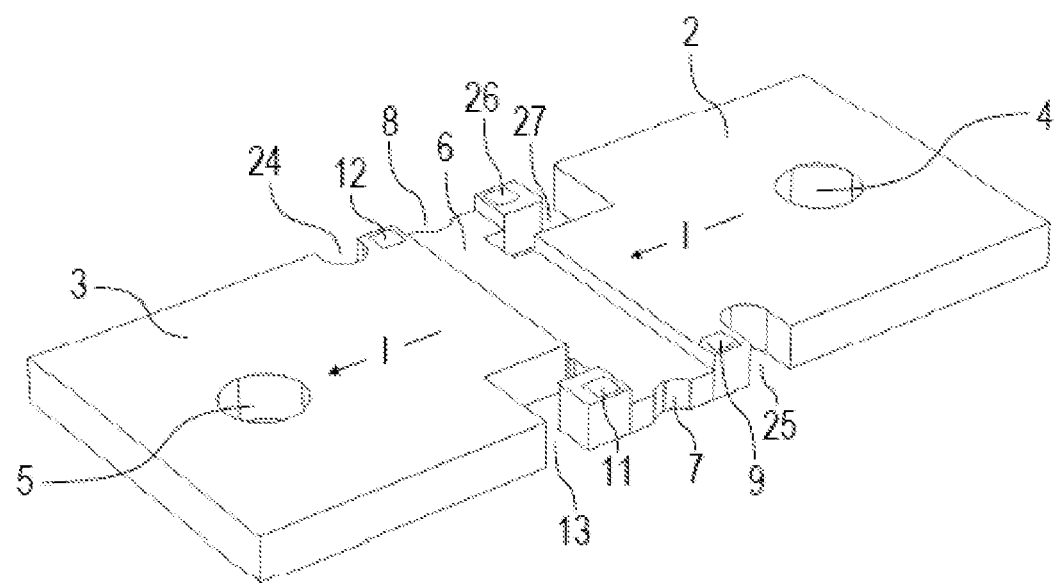

The embodiment according to FIG. 17 largely corresponds to the embodiment described above and shown in FIG. 16, so that in order to avoid repetition, reference is made to the above description, whereby the same reference signs are used for corresponding details.

A special feature of this embodiment is that the cut 27 extends further into the resistor element 6 in the embodiment according to FIG. 17 than in the embodiment according to FIG. 16. The invention is not limited to the preferred embodiments described above. Rather, a large number of variations and modifications are possible which also make use of the idea of the invention and therefore fall within the scope of protection. In particular, the invention also claims protection for the subject-matter and the features of the dependent claims independently of the respective claims referred to and, in particular, also without the features of the main claim. The invention thus comprises various aspects of the invention which enjoy protection independently of one another.

The invention claimed is:

1. A current-sensing resistor for measuring an electric current, comprising:
   a first connection part made of an electrically conductive conductor material,
   a second connection part made of an electrically conductive conductor material,
   a resistor element made of a resistor material, the resistor element being arranged in a main current flow direction between the first connection part and the second connection part, so that the current to be measured flows through the resistor element, a first voltage measurement contact at the first connection part for measuring the voltage at the first connection part, a second voltage measurement contact at the second connection part for voltage measurement at the second connection part, and a first cut in the second connection part, the first cut surrounding the second voltage measurement contact and preventing current flow across the first cut, wherein a third voltage measurement contact is arranged at the second connection part for measuring the voltage at the second connection part, and wherein the third voltage measurement contact at the second connection part is arranged offset with respect to the main current flow direction transversely to the second voltage measurement contact at the second connection part.

2. The current-sensing resistor according to claim 1, wherein the first voltage measurement contact at the first connection part together with the second voltage measurement contact at the second connection part forms a first measurement channel for measuring a first voltage drop across the resistor element and preferably parallel to the main current flow direction, and the first voltage measurement contact at the first connection part together with the third voltage measurement contact at the second connection part forms a second measurement channel in order to measure a second voltage drop across the resistor element and obliquely to the main current flow direction.

3. The current-sensing resistor according to claim 2, wherein the second voltage measurement contact at the second connection part together with the third voltage measurement contact at the second connection part forms a third measurement channel for measuring a third voltage drop transversely to the main current flow direction.

4. The current-sensing resistor according to claim 1, wherein the second voltage measurement contact at the second connection part together with the third voltage measurement contact at the second connection part forms a first measurement channel for measuring a first voltage drop transversely to the main current flow direction, and the first voltage measurement contact at the first connection part together with the third voltage measurement contact at the second connection part forms a second measure- ment channel in order to measure a second voltage drop across the resistor element obliquely to the main current flow direction.

5. The current-sensing resistor according to claim 4, wherein the first voltage measurement contact at the first connection part together with the second voltage measurement contact at the second connection part forms a third measurement channel in order to measure a third voltage drop across the resistor element and preferably parallel to the main current flow direction.

6. The current-sensing resistor according to claim 1, wherein a fourth voltage measurement contact is arranged at the second connection part, which is electrically conductively connected to the third voltage measurement contact in order to measure the voltage jointly at the third voltage measurement contact and at the fourth voltage measurement contact.

7. The current-sensing resistor according to claim 6, wherein a fifth voltage measurement contact is arranged at the first connection part and is electrically conductively connected to the first voltage measurement contact in order to measure the voltage jointly at the first voltage measurement contact and at the fifth voltage measurement contact.

8. The current-sensing resistor according to claim 6, wherein in the second connection part the third voltage measurement contact and the fourth voltage measurement contact have substantially the same distance to the centre axis of the current-sensing resistor.

9. The current-sensing resistor according to claim 6, wherein in the second connection part the second voltage measurement contact is arranged between the third voltage measurement contact and the fourth voltage measurement contact.

10. The current-sensing resistor according to claim 1, wherein the first voltage measurement contact is arranged centrally in the first connection part with respect to the side edges of the current-sensing resistor, and the second voltage measurement contact and the surrounding first cut in the second connection part are arranged centrally with respect to the side edges of the current-sensing, and the third voltage measurement contact is arranged off-centre in the second connection part, and the first voltage measurement contact in the first connection part and the second voltage measurement contact in the second connection part are at substantially the same distance from the side edges of the current-sensing resistor, so that the first voltage drop across the resistor element is measured parallel to the main current flow direction.

11. The current-sensing resistor according to claim 1, wherein the first cut in the second connection part is arc-shaped, with a base transverse to the main current flow direction and legs which face the resistor element essentially parallel to the main current flow direction.

12. The current-sensing resistor according to claim 11, wherein the legs of the first cut project into the resistor element in the main current flow direction and end in the resistor element.

13. The current-sensing resistor according to claim 11, wherein the legs of the first cut end in the second connection part before the resistor element in the main current flow direction.

14. The current-sensing resistor according to claim 11, wherein the legs of the first cut in the main current flow direction end at the boundary between the resistor element and the second connection part.

15. The current-sensing resistor according to claim 1, wherein in the second connection part the second voltage measurement contact and the surrounding first cut are arranged off-centre, and in the second connection part, the first cut starts from a side edge of the current-sensing resistor and extends in an arcuate or L-shaped manner into the resistor element or at least up to the boundary between the second connection part and the resistor element.

16. The current-sensing resistor according to claim 1, further comprising:

a second cut in the second connection part for influencing the temperature behaviour of the resistance value, the second cut in the second connection part preventing a current flow across the second cut, and a third cut in the first connection part for influencing the temperature behaviour of the resistance value, wherein the third cut in the first connection part prevents current flow across the third cut.

17. The current-sensor resistor according to claim 16, further comprising a fourth cut in the first connection part for generating a further voltage loop and/or for influencing the temperature behaviour of the resistance value, wherein the fourth cut in the first connection part prevents current flow across the fourth cut.

18. The current-sensing resistor according to claim 17, wherein:
the second cut extends from a lateral edge of the second connection part opposite the first cut,
the third voltage measurement contact is arranged in the second connection part at the same lateral edge of the second connection part as the second cut,
the third voltage measurement contact is arranged in the second connection part between the resistor element and the second cut,
the third cut extends from the lateral edge of the first connection part on the same side as the first cut,
the first voltage measurement contact is arranged in the first connection part at the same lateral edge of the first connection part as the second cut,
the first voltage measurement contact is arranged in the first connection part between the resistor element and the third cut,
the optional fourth cut in the first connection part starts from the lateral edge of the first connection part opposite the third cut, and
a fourth voltage measurement contact is optionally provided at the first connection part, wherein the fourth voltage measurement contact is arranged between the fourth cut and the resistor element.

19. The current-sensing resistor according to claim 16, wherein:
the second cut is L-shaped or arcuate, and
the third cut is L-shaped or curved or straight and optionally runs transversely to the main flow direction, and
the fourth cut is L-shaped or arcuate or straight and runs transversely to the main flow direction.

20. The current sensing resistor according to claim 19, wherein:
the second cut in the second connection part extends into the resistor element, and
the third cut in the first connection part extends into the resistor element, and
the fourth cut in the first connection part extends into the resistor element.

21. The current-sensing resistor according to claim 16, wherein the second cut has substantially the same length as the third cut.

22. The current-sensing resistor according to claim 16, wherein:
the first cut has substantially the same length as the fourth cut, or
the first cut has a different length than the fourth cut.

23. The current-sensing resistor according to claim 1, wherein:
the conductor material of the connection parts has a smaller specific electrical resistance than the resistor material of the resistor element, and
the resistor element is electrically and mechanically connected to the two connecting elements, and
the resistor material has a specific electrical resistance which is less than $2 \cdot 10^{-4} \Omega \cdot m$, and
the resistor material has a specific electrical resistance greater than $2 \cdot 10^{-6} \Omega \cdot m$, and
the conductor material has a specific electrical resistance which is smaller than $10^{-6} \Omega \cdot m$, and
the current-sensing resistor is of low resistance with a resistance value of at most $1 \mu \Omega$, and
the resistor element is plate-shaped, and
the connection parts are each plate-shaped.

24. The current-sensing resistor according to claim 1, wherein:
the current-sensing resistor has a length in the main current flow direction which is smaller than 30 cm, and
the current-sensing resistor has a width at right angles to the main current flow direction which is smaller than 20 cm, and
the current-sensing resistor has a thickness which is smaller than 10 mm.

25. The current-sensing resistor according to claim 1, wherein the two connection parts each have at least one current connection for introducing and discharging the current, the individual current connections preferably each having at least one hole in the respective connection part.

26. The current-sensing resistor according to claim 1, wherein:
the individual voltage measurement contacts are in each case contact pads which consist of an electrically conductive coating at the respective connection part, and
the coating of the contact pads consists of a different conductor material than the connection parts,.

27. The current-sensing resistor according to claim 1, wherein three voltage measurement contacts are provided which form a three-point tap on a closed loop at the first connection part on the one hand and at the second connection part on the other hand, the three-point tap providing three measurement channels which supply three voltage measurement values in order to enable fault diagnosis.

28. A current measuring device comprising:
a current-sensing resistor according to claim 1 and
a voltage measuring device for separate voltage measurement in the first measurement channel and in the second measurement channel and optionally additionally in the third measurement channel, and
an evaluation unit.

29. The current measuring device according to claim 28, wherein the evaluation unit is adapted for determining the current flowing through the current-sensing resistor from the voltage measurement values in the various measurement channels.

30. The current measuring device according to claim 29, wherein:
the voltage measuring device measures the following voltages:
U12: Voltage between the first voltage measurement contact at the first connection part and the second voltage measurement contact at the second connection part,
U23: Voltage between the second voltage measurement contact at the second connection part and the third voltage measurement contact at the second connection part,
U13: Voltage between the first voltage measurement contact at the first connection part and the third voltage measurement contact at the second connection part,
the evaluation unit is adapted to calculate the following deviation $\Delta U$ from the voltages U12, U23 and U13:

$$\Delta U = U12 + U23 - U13, \text{ and}$$

the evaluation unit generates an error signal if the deviation $\Delta U$ exceeds a permissible maximum value.

31. The current measuring device according to claim 28, wherein the evaluation unit is adapted for diagnosing a measurement error by evaluating the voltage measurement values in the various measurement channels.

32. A current measuring method for measuring an electric current by means of a current measuring device according to claim 28, comprising the following steps:
- passing the electric current to be measured through the current-sensing resistor, measuring the following voltages at the current-sensing resistor while the current to be measured flows through the current-sensing resistor:
- U12: Voltage between the first voltage measurement contact at the first connection part and the second voltage measurement contact at the second connection part,
- U23: Voltage between the second voltage measurement contact at the second connection part and the third voltage measurement contact at the second connection part,
- U13: Voltage between the first voltage measurement contact at the first connection part and the third voltage measurement contact at the second connection part,
- calculating the current as a function of at least one of the measured voltages U12, U13, U23.

33. The current measuring method according to claim 32, further comprising the following steps for fault diagnosis:
- Calculating a deviation ΔU from the voltages U12, U23 and U13 according to the following formula:

$\Delta U = U12 + U23 - U13$, and

- Generating an error signal if the deviation ΔU exceeds a maximum value.

34. A current measuring method for measuring an electric current by means of a current measuring device according to claim 28, comprising the following steps:
- passing the electric current to be measured through the current-sensing resistor,
- measuring the following voltages at the current-sensing resistor while the current to be measured flows through the current-sensing resistor:
- U34: Voltage between the third voltage measurement contact at the second connection part and the fourth voltage measurement contact at the first connection part,
- U41: Voltage between the fourth voltage measurement contact at the first connection part and the first voltage measurement contact at the first connection part,
- U31: Voltage between the third voltage measurement contact at the second connection part and the first voltage measurement contact at the first connection part,
- calculating the current as a function of at least one of the measured voltages U34, U41, U31.

35. The current measuring method according to claim 34, further comprising the following steps for fault diagnosis:
- calculating a deviation ΔU from the voltages U34, U41, U31 according to the following formula:

$\Delta U = U34 + U41 - U31$, and

- generating a fault signal if the deviation ΔU exceeds a maximum value.

* * * * *